(12) United States Patent
Kim

(10) Patent No.: US 6,682,986 B2
(45) Date of Patent: Jan. 27, 2004

(54) METHOD OF FORMING SHALLOW TRENCH ISOLATION AND METHOD OF MANUFACTURING A SEMICONDUCTOR DEVICE USING THE SAME

(75) Inventor: Sung-Hoan Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/100,169

(22) Filed: Mar. 19, 2002

(65) Prior Publication Data

US 2002/0168850 A1 Nov. 14, 2002

(30) Foreign Application Priority Data

Apr. 25, 2001 (KR) ......................... 2001-22372

(51) Int. Cl.[7] .............................................. H01L 21/76
(52) U.S. Cl. ...................................................... 438/426
(58) Field of Search ................................ 438/426, 427, 438/425, 637

(56) References Cited

U.S. PATENT DOCUMENTS

| | | | | |
|---|---|---|---|---|
| 6,025,249 A | * | 2/2000 | Kuo ........................... | 438/426 |
| 6,096,623 A | * | 8/2000 | Lee ............................ | 438/425 |
| 6,228,727 B1 | * | 5/2001 | Lim et al. .................. | 438/296 |
| 6,232,203 B1 | * | 5/2001 | Huang ........................ | 438/424 |
| 6,429,136 B2 | * | 8/2002 | Miwa ......................... | 438/692 |
| 6,468,853 B1 | * | 10/2002 | Balasubramanian et al. ......................... | 438/221 |
| 6,479,369 B1 | * | 11/2002 | Miyoshi ..................... | 438/435 |

* cited by examiner

*Primary Examiner*—Hoai Ho
*Assistant Examiner*—Thao P Le

(57) ABSTRACT

A method of forming a shallow trench isolation of a semiconductor device, includes providing a semiconductor substrate including field and active regions; forming a first insulating layer and a mask layer on the active region that expose the field region; etching the exposed field region to form a shallow trench; etching a portion of the mask layer to recess the mask layer a predetermined distance from an edge of the trench; forming a second insulating layer in the trench, the second insulating layer having a step higher than the active region; forming a liner layer as covering the mask layer and the second insulating layer; forming a third insulating layer as covering the liner layer and filling the trench; etching the mask, liner and third insulating layers to provide a planarized surface; removing the remaining mask layer; and removing the remaining first insulating layer.

26 Claims, 15 Drawing Sheets

METHOD OF FORMING SHALLOW TRENCH ISOLATION AND METHOD OF MANUFACTURING A SEMICONDUCTOR DEVICE USING THE SAME

The present application claims priority under 35 U.S.C. §119 to Korean Patent Application No. 2001-22372, filed on Apr. 25, 2001, which is hereby incorporated by reference in its entirety for all purposes.

BACKGROUND OF THE INVENTION

1. Field of the Invention

The present invention relates to a semiconductor memory device, and more particularly, to a method of forming shallow trench isolation and a method of manufacturing a semiconductor memory device using the same.

2. Description of Related Art

A shallow trench isolation (STI) serves as an isolation region to prevent a short circuit between two adjacent devices, such as transistors. A STI is formed such that a shallow trench is formed in a semiconductor substrate by anisotropic etching using a silicon nitride layer as a hard mask, and the shallow trench is then filled with an insulating layer.

The STI has different characteristics depending on whether it has a liner layer or not. In the case of the STI having no liner layer, there is a problem in that defects such as a shallow pits occur due to a subsequent oxidation. The defects deteriorate electrical characteristics of the corresponding devices, and may cause a leakage current in a junction region (e.g., p-n junction region) thereof, thereby affecting isolation of the device.

In an effort to solve these problems, a technique of forming the STI as including a liner layer has been developed. FIGS. 1A to 1F are cross-sectional views illustrating such a process of forming a conventional STI.

Referring to FIG. 1A, a semiconductor substrate 10 having a pad oxide layer 11 and a mask layer 12 formed thereon is provided. The semiconductor substrate 10 is made of silicon and has a field region 10-1 and active regions 10-2. The mask layer 12 is made of a nitride. The substrate 10 and the pad oxide layer 11 are patterned using the mask layer 12 to form a shallow trench 13 in the field region 10-1 of the substrate 10.

Referring to FIG. 1B, a buffer oxide layer 14 is formed in the shallow trench 13, and then a liner layer 15 is formed to cover the buffer oxide layer 14. The buffer oxide layer 14 is formed by growing a thermal oxide layer on side portions and a bottom portion of the shallow trench 13, in order to cure any damage that may have occurred during an etching process of the semiconductor substrate 10 for forming the trench 13 and to prevent stress and/or a trap center from developing between the liner layer 15 and the silicon substrate 10. The liner layer is generally made of a nitride.

Subsequently, as shown in FIG. 1C, the shallow trench 13 is filled with an insulating layer 16. Thereafter, as shown in FIG. 1D, the liner layer 15 and the insulating layer 16 formed on the mask layer 12 are polished by a CMP process so as to planarize a surface of the substrate 10, so that the mask layer 12 of a predetermined thickness remains.

Next, as shown in FIG. 1E, the mask layer 12 is removed. Finally, as shown in FIG. 1F, a wet-etching process is performed to remove the pad oxide layer 11. As a result, a completed shallow trench isolation (STI) 17 is formed.

The STI 17 as described above can prevent defects from occurring due to subsequent oxidation. However, this conventional method of forming the STI has a problem in that when the mask layer 12 is removed, as shown in FIG. 1E, portions of the liner layer 15 within the shallow trench 13 are also removed, thereby forming dents 18. In addition, as shown in FIG. 1F, due to the subsequent wet-etching process used to remove the pad oxide layer 11, dents 18 become deeper and broader. As a result, an electric field concentration occurs and a transistor hump is formed.

FIG. 2 is a photograph of the STI fabricated according to a conventional method such as described above. As can be seen in FIG. 2, a very deep dent 28 is formed at the top corner of shallow trench 23, i.e., both ends of the active region 10-2 of FIG. 1. In FIG. 2, liner layer 25 is illustrated as formed in the trench 23. Additionally, due to stress occurring during a subsequent thermal oxidation process to form a gate oxide layer, a portion of the gate oxide layer on the top corner portion of the shallow trench 23 is formed as being thinner than that on the active region 20-2. That is, a thinning of the gate oxide layer occurs.

FIGS. 3A to 3F are cross-sectional views illustrating a conventional process of forming the STI, which prevents formation of dents. Referring to FIG. 3A, a semiconductor substrate 30 having a pad oxide layer 31 and a mask layer 32 formed thereon is provided. The semiconductor substrate 30 is made of silicon and has a field region 30-1 and active regions 30-2. The mask layer 32 is made of a nitride. The substrate 30 and the pad oxide layer 31 are patterned using the mask layer 32 to form a shallow trench 33 in the field region 30-1 of the substrate 30.

Referring to FIG. 3B, a buffer oxide layer 34 is formed to cover the shallow trench 33. The mask layer 32 is isotropically etched to expose a portion of the buffer oxide layer 34 on a top corner of the shallow trench 33. Thereafter, as shown in FIG. 3C, a liner layer 35 is formed over the whole surface of the substrate 30. The shallow trench 33 is filled with an insulating layer 36 and the liner layer 35 is generally made of a nitride.

Subsequently, as shown in FIG. 3D, the liner layer 35 and the insulating layer 36 formed on the mask layer 32 are polished by a CMP process so as to planarize a surface of the substrate 30, so that the mask layer 32 and the liner layer 35 of a predetermined thickness remain.

Referring to FIG. 3E, the remaining mask layer 32 and liner layer 35 are removed. Referring to FIG. 3F, the pad oxide layer 31 remaining on the active regions 30-2 of the substrate 30 are removed by a wet-etching technique, and the structure is planarized, whereby a STI isolation 37 is completed.

However, even though the occurrence of a dent is prevented in the above noted conventional fabrication method, the STI of FIG. 3F has the following problem. Due to stress of the mask layer 32 formed on the active regions 30-2 of the substrate 30, there is a tendency that a lesser amount of buffer oxide layer 34 than desired grows at a top corner of the shallow trench 33. In order to overcome this stress and grow a sufficient amount of buffer oxide layer 34 at the top corner of the shallow trench 33, the buffer oxide layer 34 has to be formed thicker than otherwise necessary. However, when the buffer oxide layer 34 is formed thicker, there occurs a problem in that a junction leakage current increases.

With further regard to the conventional fabrication methods, a cleaning process is generally performed before a process to form the gate oxide layer. The buffer oxide layer 34 is exhausted during the cleaning process to cause a dent. Also, when the gate oxide layer is formed in a subsequent process, the gate oxide layer becomes thinner at the top corner of the shallow trench than at other portions thereof. That is, a thinning of the gate oxide layer occurs. Such a thinning of the gate oxide layer becomes deeper in the case of a dual gate oxide layer. This is described below with reference to FIGS. 4A to 4E.

FIGS. 4A to 4E are cross-sectional views illustrating a conventional process of forming a gate oxide layer, subsequent to the structure as formed in FIG. 3F. Referring to FIG. 4A, the STI 45 includes a shallow trench 41 formed in the field region 40-1 of a substrate 40. A buffer oxide layer 42, a liner layer 43 and an insulating layer 44 are formed in the shallow trench 41. The substrate 40 further includes first and second active regions 40-21 and 40-22. A relatively thick gate oxide layer is to be formed on the first active region 40-21, and a relatively thin gate oxide layer is to be formed on the second active region 40-22.

Referring to FIG. 4B, a cleaning process is performed. The buffer oxide layer 42 is exhausted during the cleaning process, so that dents 45a occur at the top corners of the shallow trench 41.

Referring to FIG. 4C, a relatively thick first gate oxide layer 46 is formed on the whole surface of the substrate 40 other than the STI 45, as having a thickness TOX11. A portion of the first gate oxide layer 46 on the top corners of the shallow trench 41 in which the dents 45a occurs has a thickness TOX12, which is thinner than the other portion thereof.

Referring to FIG. 4D, a wet-etching process is performed to remove a portion of the first gate oxide layer 46 formed on the second active region 40-22. The dent 45a is deepened by the wet-etching process. At this point, the thicker that first gate oxide layer 46 is, the deeper dent 45a becomes.

Referring to FIG. 4E, a relatively thin second oxide layer 47 is formed on the second active region 40-22 of the substrate 40, as having thickness TOX21.

Accordingly, a portion of the second gate oxide layer 47 on the top corner of the shallow trench 41 in which the dent 45a occurs, has a thickness TOX22 thinner than other portions thereof. As described above, in a semiconductor device having such a conventional STI, a thinning of the gate oxide layer as well as formation of dents occur, whereupon the gate oxide layer is non-uniformly formed. A gate oxide layer having a non-uniform thickness lowers a breakdown voltage, so that a parasitic current occurs in a transistor, thereby deteriorating characteristics of the device.

SUMMARY OF THE INVENTION

The present invention is therefore directed to a method of forming shallow trench isolation and a method of manufacturing a semiconductor device using the same, which substantially overcome one or more of the problems due to the limitations and disadvantages of the related art.

To overcome the above noted and other problems, a method of forming a semiconductor device having a shallow trench isolation (STI) which can prevent occurrence of dents and insufficient, non-uniform growth of a gate oxide layer, is provided.

It is another object of the present invention to provide a method of forming a semiconductor device having a STI, whereby the semiconductor device has excellent device characteristics.

In order to achieve the above noted objects, an embodiment of the present invention provides a method of forming a shallow trench isolation of a semiconductor device, including: a) providing a semiconductor substrate including a field region and an active region; b) forming a first insulating layer and a mask layer on the active region that expose the field region of the substrate; c) etching the exposed field region of the substrate to form a shallow trench; d) etching a portion of the mask layer to recess the mask layer a predetermined distance from an edge of the shallow trench; e) forming a second insulating layer in the shallow trench, the second insulating layer having a step higher than the active region; f) forming a liner layer as covering the mask layer and the second insulating layer within the shallow trench; g) forming a third insulating layer as covering the liner layer and filling the shallow trench; h) etching the mask layer, the liner layer and the third insulating layer to provide a planarized surface; i) removing a remaining portion of the mask layer; and j) removing a remaining portion of the first insulating layer.

An additional object of the present invention provides a method of forming a semiconductor device, including: providing a substrate including a field region, an active region and a shallow trench isolation, the shallow trench isolation being formed in the field region of the substrate and including a first insulating layer, a liner layer on the first insulating layer, and a second insulating layer on the liner layer, the first insulating layer having a step higher than the active region of the substrate; cleaning the substate; forming a gate oxide layer on the active region of the substrate; and forming a gate on the gate oxide layer.

A further embodiment of the present invention provides a method of forming a shallow trench isolation of a semiconductor device, including: a) providing a semiconductor substrate including a field region and an active region; b) forming a first insulating layer and a mask layer that expose the field region of the substrate; c) etching the exposed field region of the substrate to form a shallow trench; d) etching a portion of the mask layer to recess the mask layer a predetermined distance from an edge of the shallow trench; e) forming a second insulating layer in the shallow trench, the second insulating layer having a step higher than the active region; f) forming a liner layer as covering the mask layer and the second insulating layer within the shallow trench; g) forming a third insulating layer as covering the liner layer and filling the shallow trench; h) etching the mask layer, the liner layer and the third insulating layer to provide a planarized surface; i) removing a remaining portion of the mask layer; j) removing a remaining portion of the first insulating layer; k) cleaning the substrate; and l) forming a gate oxide layer on the active region of the substrate.

A still further embodiment of the present invention provides a method of forming a semiconductor device, including: providing a substrate including a field region, first and second active regions and a shallow trench isolation, the shallow trench isolation being formed in the field region of the substrate and including a first insulating layer, a liner layer on the first insulating layer, and a second insulating layer on the liner layer, the first insulating layer having a step higher than the first and second active regions of the substrate; cleaning the substate; forming a first gate oxide layer over an entire surface of the substrate; etching the first gate oxide layer so that the first gate oxide layer remains on the first active region of the substrate; and forming a second gate oxide layer on the second active region of the substrate.

An additional further embodiment of the present invention provides a method of forming a semiconductor device, including: a) providing a semiconductor substrate including a field region and first and second active regions; b) forming a first insulating layer and a mask layer on the substrate that expose the field region of the substrate; c) etching the exposed field region of the substrate to form a shallow trench; d) etching a portion of the mask layer to recess the mask layer a predetermined distance from an edge of the shallow trench; e) forming a second insulating layer in the shallow trench, the second insulating layer having a step higher than the first and second active regions; f) forming a liner layer as covering the mask layer and the second insulating layer within the shallow trench; g) forming a third insulating layer as covering the liner layer and filling the shallow trench; h) etching the mask layer, the liner layer and the third insulating layer to provide a planarized surface; i) removing a remaining portion of the mask layer; j) removing a remaining portion of the first insulating layer; k) cleaning the substate; l) forming a first gate oxide layer over an entire surface of the substrate; m) etching the first gate oxide layer so that the first gate oxide layer remains on the first active region of the substrate; and n) forming a second gate oxide layer on the second active region of the substrate.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF PREFFERED EMBODIMENTS

Figure 1A:
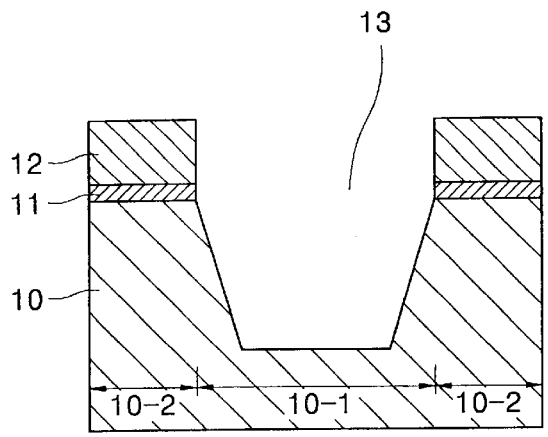
FIGS. 1A to 1F are cross-sectional views illustrating a conventional process of forming a STI.
Figure 1B:
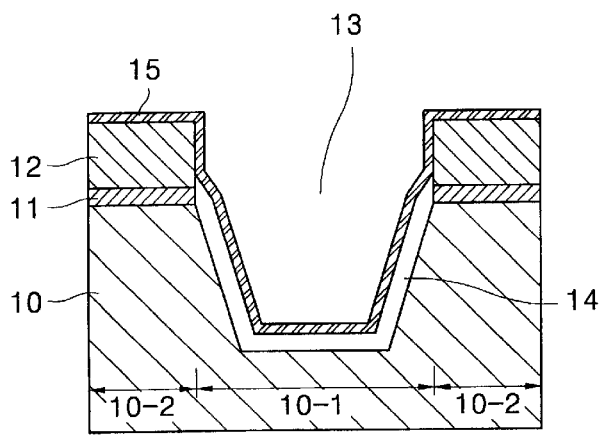
Figure 1C:
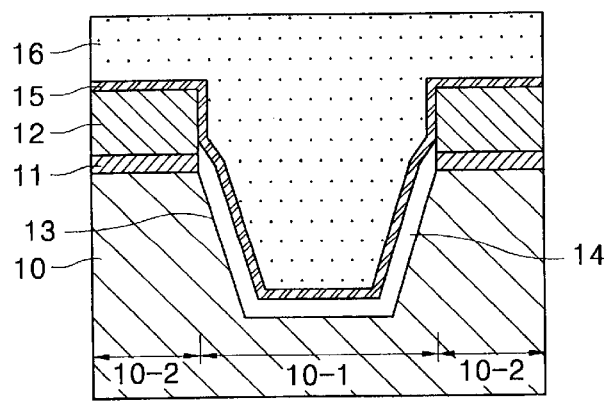
Figure 1D:
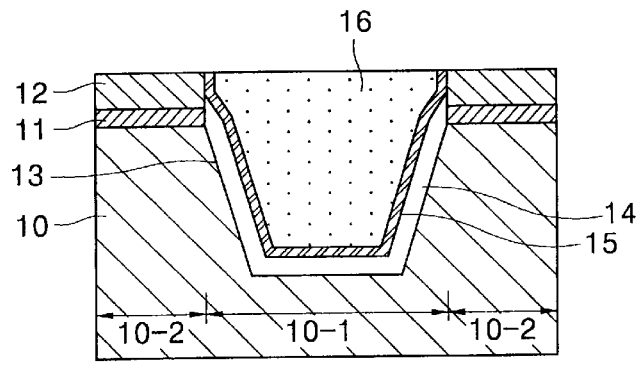
Figure 1E:
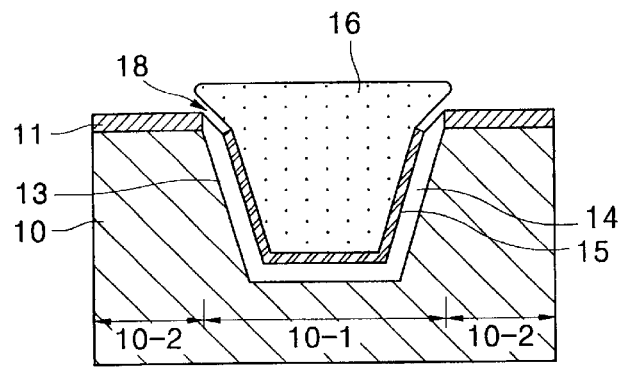
Figure 1F:
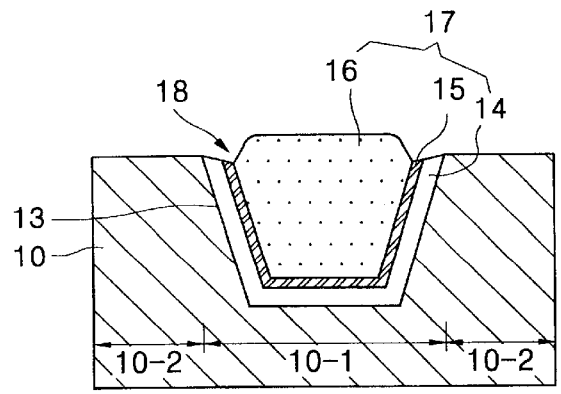
Figure 2:
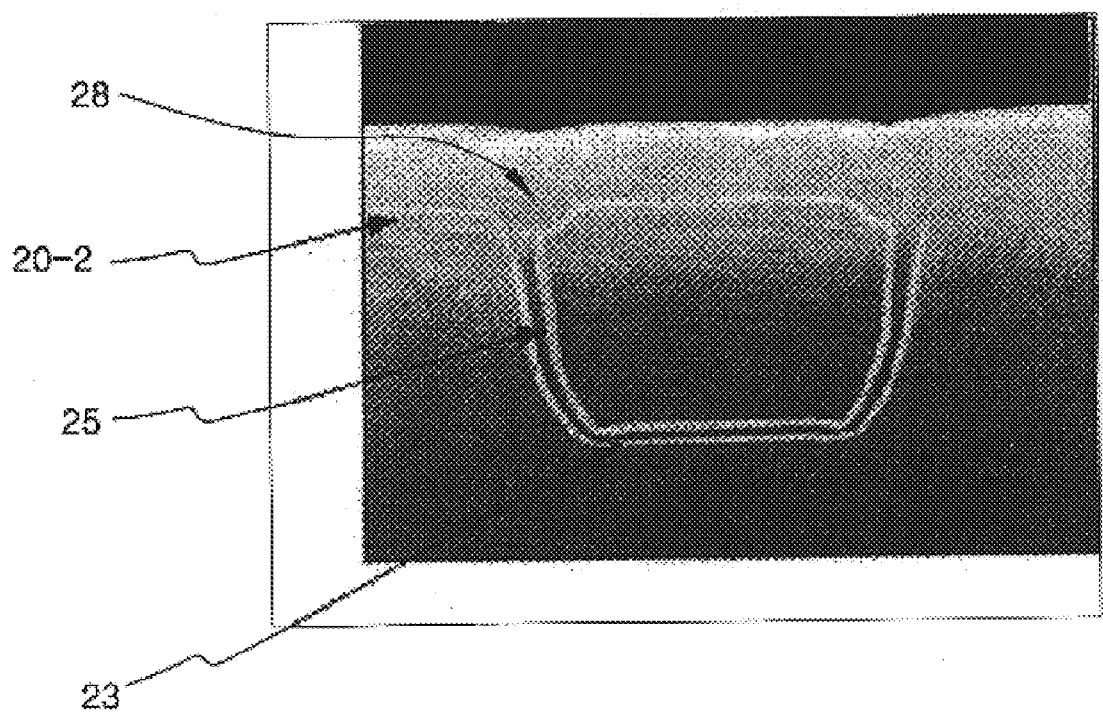
FIG. 2 is a photograph of the STI manufactured by a process of FIGS. 1A to 1F.
Figure 3A:
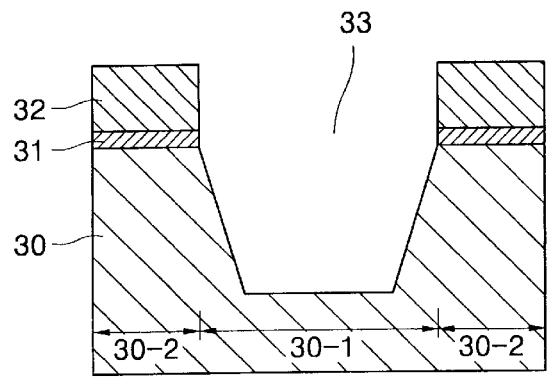
FIGS. 3A to 3F are cross-sectional views illustrating a conventional process of forming STI, which prevents occurrence of a dent.
Figure 3B:
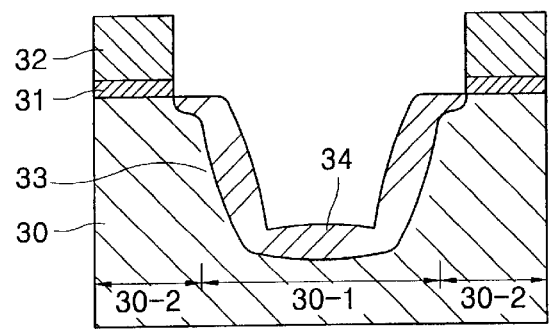
Figure 3C:
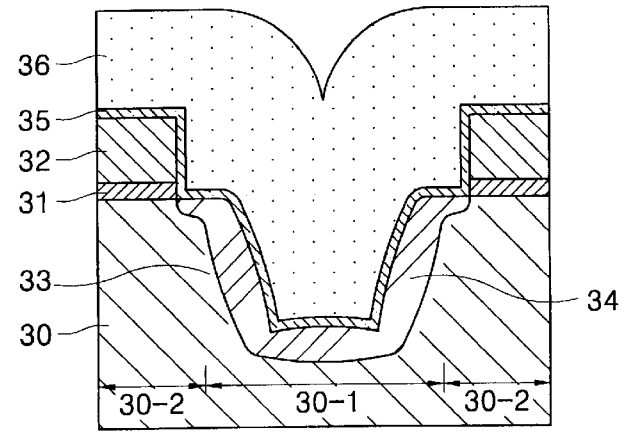
Figure 3D:
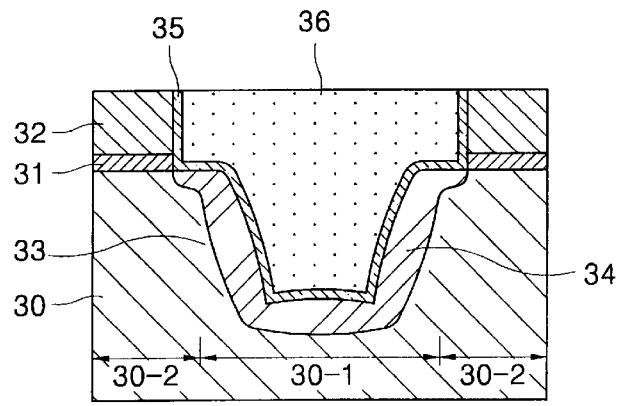
Figure 3E:
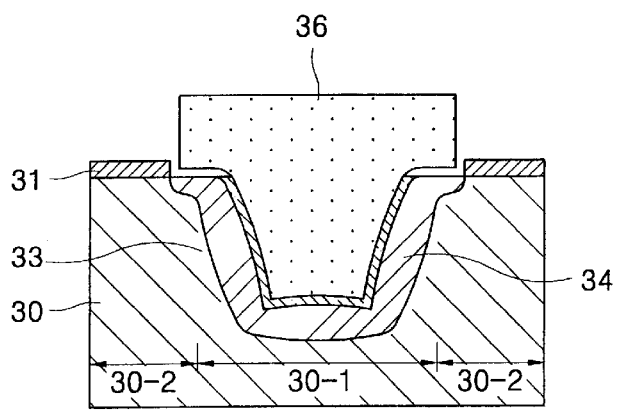
Figure 3F:
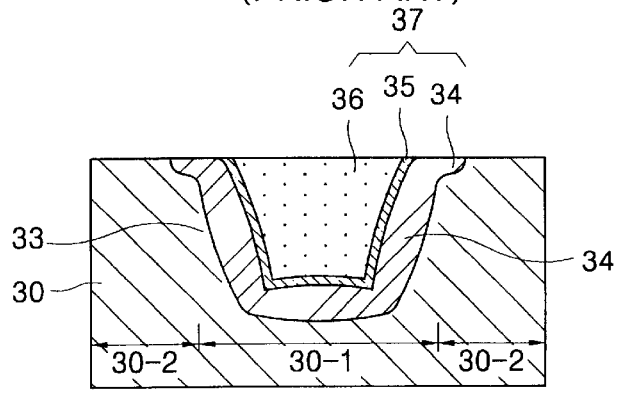
Figure 4A:
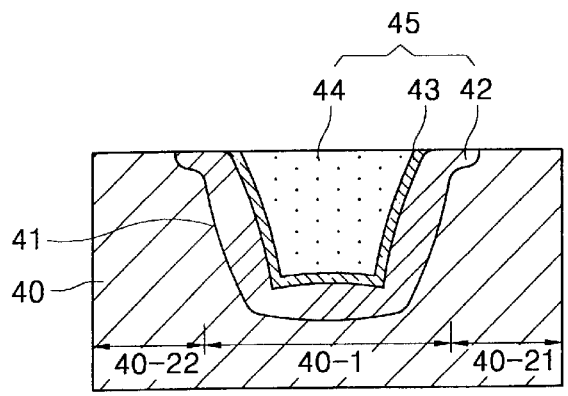
FIGS. 4A to 4E are cross-sectional views illustrating a conventional process of forming a gate oxide layer, subsequent to formation of the structure as shown FIG. 3F.
Figure 4B:
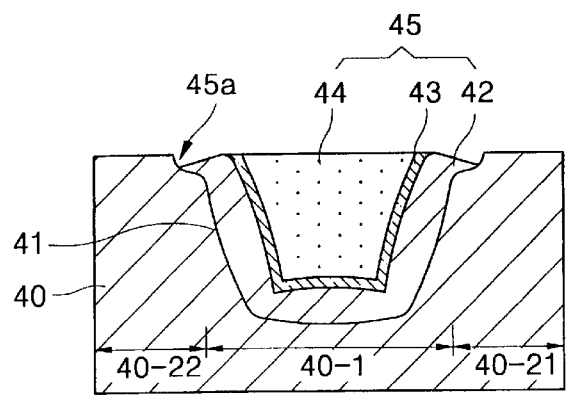
Figure 4C:
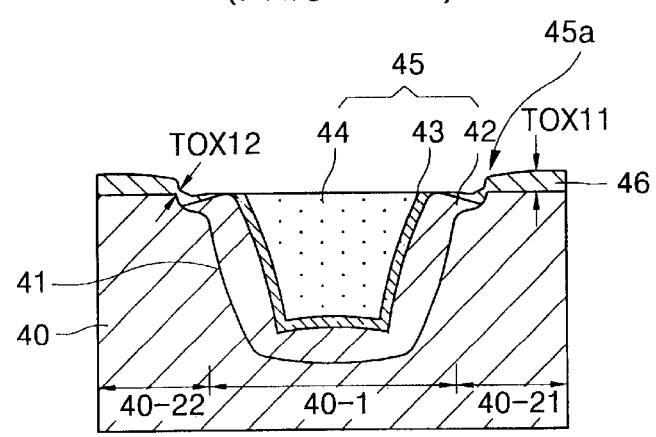
Figure 4D:
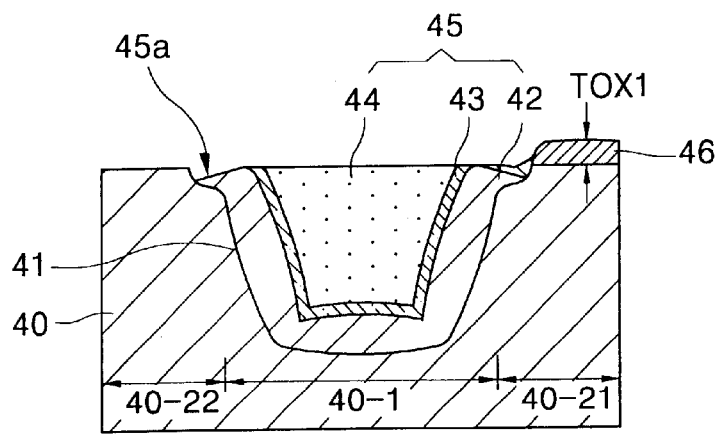
Figure 4E:
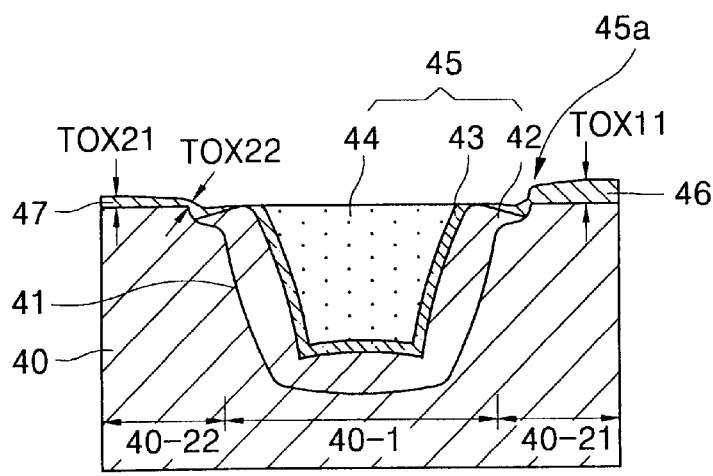

Reference will now be made in detail to preferred embodiments of the present invention, examples of which is illustrated in the accompanying drawings, wherein like reference numeral denote like parts.

Figure 5A:
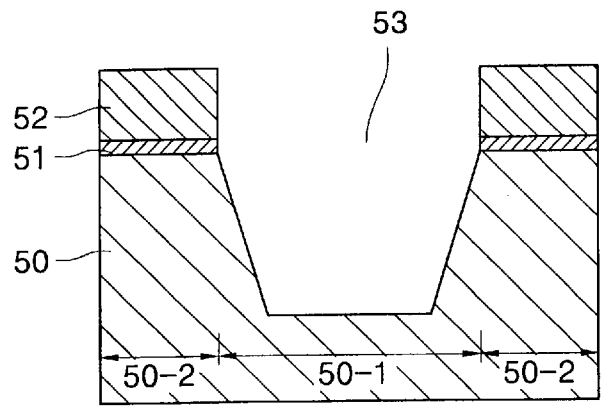
FIGS. 5A to 5F are cross-sectional views illustrating a process of forming a STI according to an embodiment of the present invention.

FIGS. 5A to 5F are cross-sectional views illustrating a process of forming a STI according to an embodiment of the present invention. Referring to FIG. 5A, a semiconductor substrate 50 having a pad oxide layer 51 and a mask layer 52 formed thereon is provided. The semiconductor substrate 50 is made of silicon and has a field region 50-1 and active regions 50-2. The mask layer 52 is made of a nitride. Although not shown, mask layer 52 is patterned. Then, the substrate 50 and the pad oxide layer 51 are patterned using the mask layer 52 to form a shallow trench 53 in the field region 50-1 of the substrate 50, as illustrated.

Figure 5B:
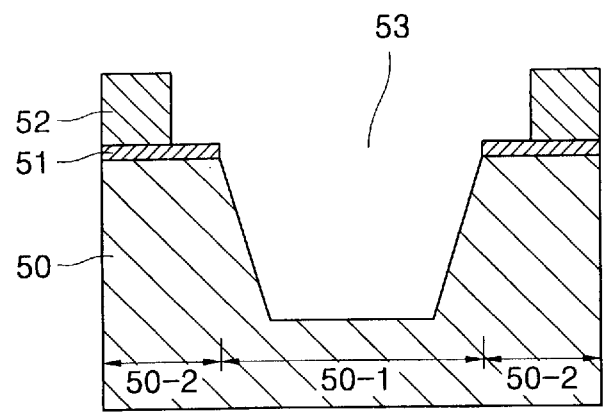

Referring to FIG. 5B, the mask layer 52 is wet-etched using phosphoric acid, to be recessed or etched back a predetermined distance from the shallow trench 53. This process is generally called a pull-back process. A pull-back amount of the mask layer 52 depends on an amount of a buffer oxide layer that is to be etched in a subsequent wet-etching process and depends on a thickness of a gate oxide layer that will be formed in a subsequent process. As an example, in an embodiment of the invention, a pull-back amount of the mask layer 52 is twice as much as a thickness of the gate oxide layer. In the case of a dual gate oxide layer, a pull-back amount of the mask layer 52 is determined in consideration of a thickness of the gate oxide layer.

Figure 5C:
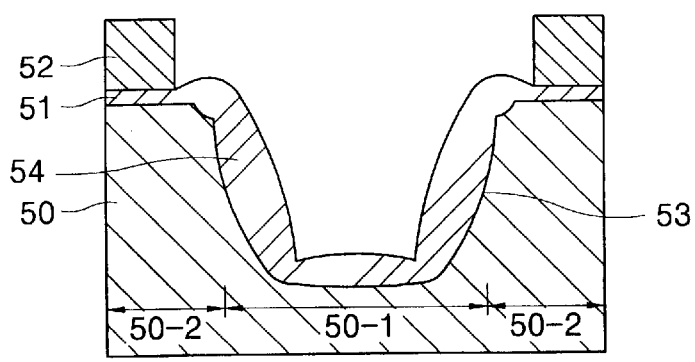

Referring to FIG. 5C, a buffer oxide layer 54 is formed by a thermal oxidation process to cover the shallow trench 53 and to be formed on the pad oxide layer 51 exposed by recessed mask layer 52. The buffer oxide layer 54 has a great enough thickness to prevent a thinning of the gate oxide layer, even though the buffer oxide layer 54 is exhausted in a subsequent wet-etching process. The buffer oxide layer 54 may have a thickness of 100 Å to 700 Å. The buffer oxide layer 54 can be made of a CVD oxide which has a relatively low wet-etching rate, instead of a thermal oxide.

Figure 5D:
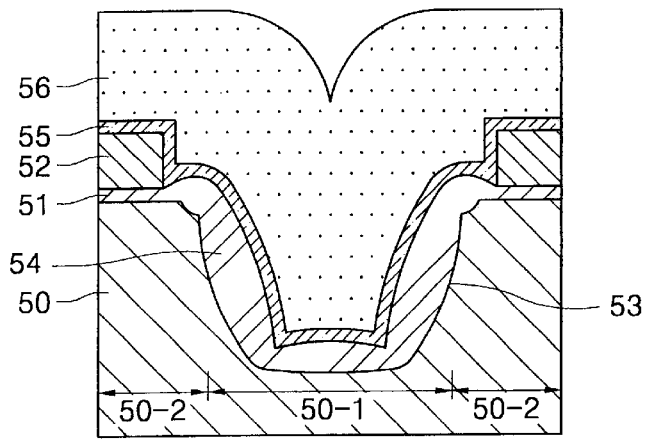

Referring to FIG. 5D, a liner layer 55 is formed over the whole surface of the structure, including on the mask layer 52 and the buffer oxide layer 54 within the shallow trench 53. The resulting structure is then covered with an insulating layer 56, whereby shallow trench 53 is filled with the insulating layer 56. The liner layer 55 may be a nitride, and the insulating layer 56 may be a high density plasma oxide (HDP $SiO_2$) or an undoped silicon glass (USG).

Figure 5E:
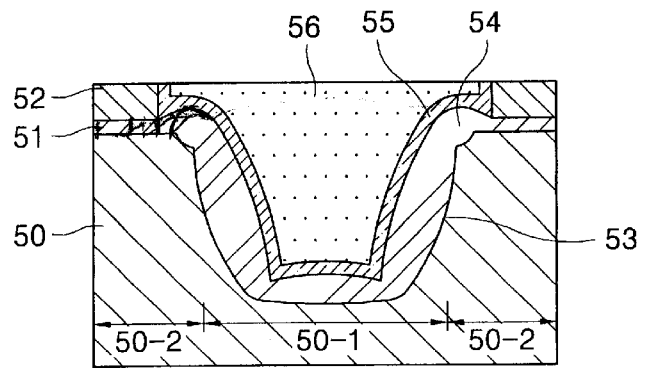

Referring to FIG. 5E, the recessed mask layer 52, the liner layer 55 and the insulating layer 56 are polished by a CMP process to planarize a surface of the semiconductor substrate 50.

Figure 5F:
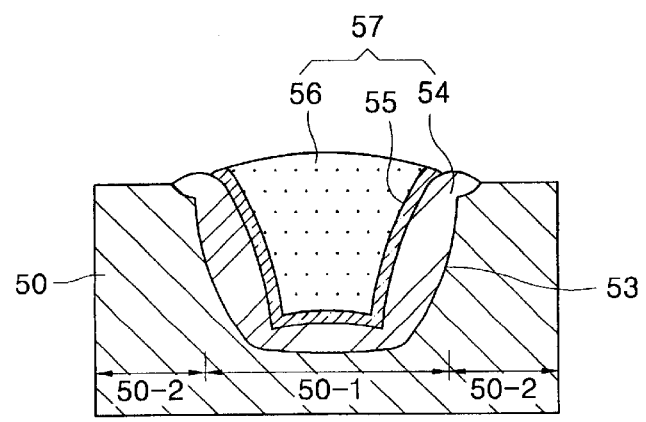

Referring to FIG. 5F, the mask layer 52 is removed. The pad oxide layer 51 is then removed by a wet-etching process to complete a shallow trench isolation (STI) 57.

Figure 6A:
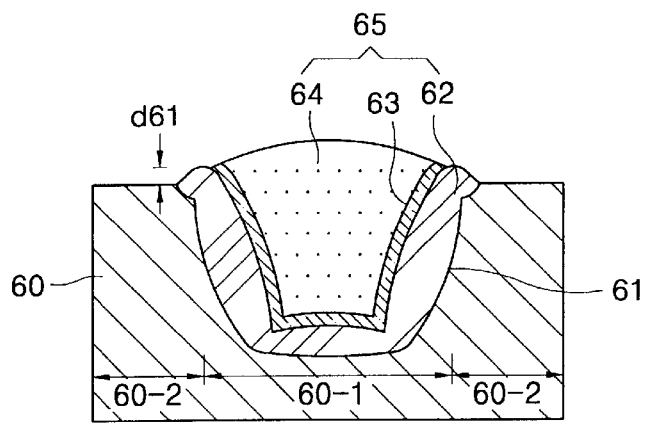
FIGS. 6A to 6C are cross-sectional views illustrating a process of manufacturing a semiconductor device, according to an embodiment of the present invention.
Figure 6B:
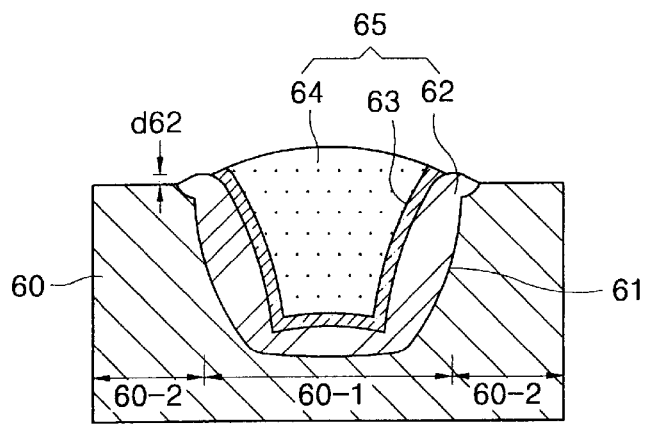
Figure 6C:
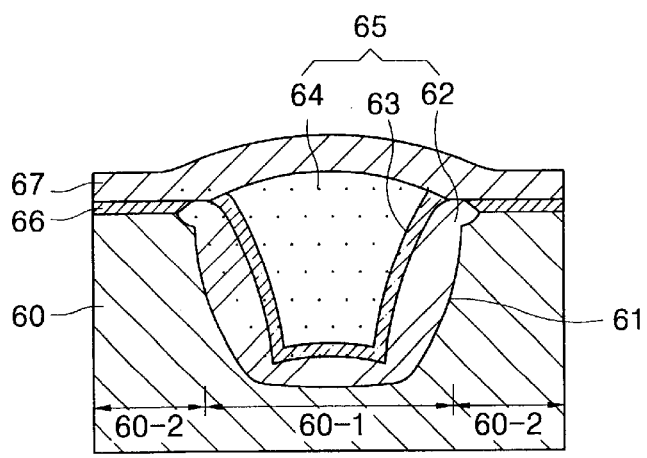

FIGS. 6A to 6C are cross-sectional views illustrating a process of manufacturing a semiconductor device of an embodiment of the present invention. FIGS. 6A to 6C show a process subsequent to formation of the structure as illustrated in FIG. 5F.

Referring to FIG. 6A, a semiconductor substrate 60 having a field region 60-1 and active regions 60-2 is provided. A shallow trench 61 is formed in the field region 60-1 of the semiconductor substrate 60. A STI 65 including a buffer oxide layer 62, a liner layer 63 and an insulating layer 64 is formed in the shallow trench 61 by the same method as described in FIGS. 5A to 5F. The liner layer 63 is for example a nitride. The STI 65 is formed to have a step higher than the active region 60-2 of the substrate 60. The STI 65 has a step height d61 above the surface of active region 60-2. That is, the buffer oxide layer 62 is higher than a surface of the active region 60-2 of the substrate 60 by the step height d61.

Referring to FIG. 6B, a cleaning process is performed. The buffer oxide layer 62 is exhausted slightly during the cleaning process. However, since the buffer oxide layer 62 is formed to a sufficient thickness in consideration of this, the STI 65 subsequently has a step d62 that is smaller than the step height d61.

Referring to FIG. 6C, a gate oxide layer 66 is formed over the whole surface of the substrate 60 at the active regions 60-2. Then, a gate 67 is formed on the gate oxide layer 66 and on the STI 65. The gate 67 is made of a conductive material such as polysilicon.

Since the STI 65 has a step height d62 with respect to the active regions 60-2 of the substrate 60, a thinning of the gate oxide layer does not occur. Accordingly, the gate oxide layer 66 has uniform thickness. As a result, a breakdown resulting from thinning of the gate oxide layer does not occur when a bias voltage is applied to the gate 65, thereby improving characteristics of a device.

Figure 7A:
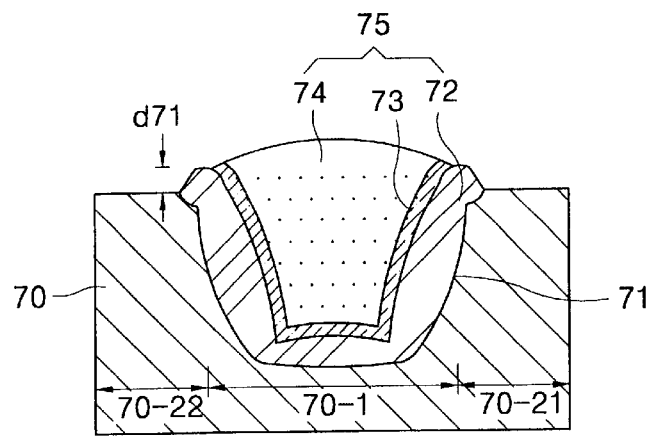
FIGS. 7A to 7E are cross-sectional views illustrating a process of manufacturing a semiconductor device having a dual gate oxide layer, according to another embodiment of the present invention.

FIGS. 7A to 7E are cross-sectional views illustrating a process of manufacturing a semiconductor device having a dual gate oxide layer, in accordance with another embodiment of the present invention. Referring to FIG. 7A, a semiconductor substrate 70 having a field region 70-1 and first and second active regions 70-21 and 70-22 is provided. A shallow trench 71 is formed in the field region 70-1 of the semiconductor substrate 70. A STI 75 including a buffer oxide layer 72, a liner layer 73 and an insulating layer 74 is formed in the shallow trench 71, by the same method as described in FIGS. 5A to 5F. The liner layer 73 is made of a nitride, for example. The STI 75 is formed to have a step height d71 with respect to the active regions 70-21 and 70-22 of the substrate 70. That is, the buffer oxide layer 72 is higher than the surface of active regions 70-21 and 70-22 of substrate 70 by the step height d71.

Figure 7B:
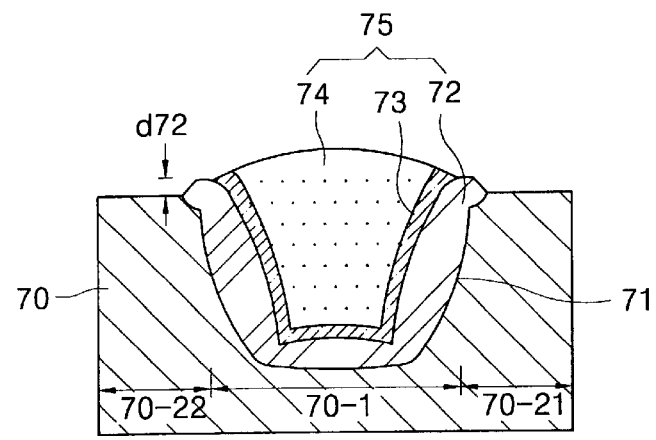

Referring to FIG. 7B, a cleaning process is performed. The buffer oxide layer 72 is exhausted slightly during the cleaning process. However, since the buffer oxide layer 72 is formed to have a sufficient thickness in consideration of this, the STI 75 subsequently has a step height d72 that is smaller than the step height d71.

Figure 7C:
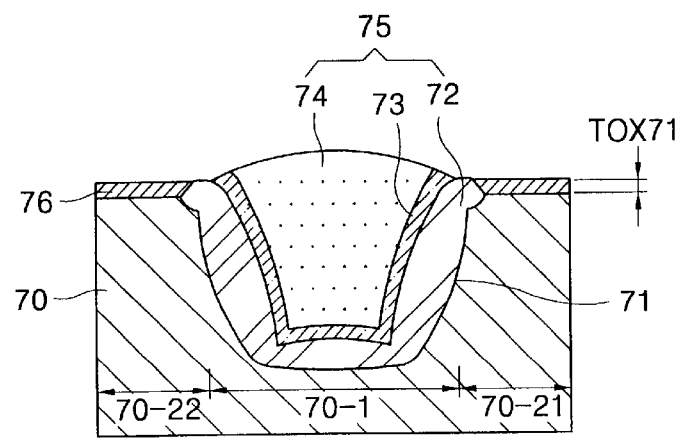

Referring to FIG. 7C, a relatively thick first gate oxide layer 76 is formed on the first active region 70-21 and the second active region 70-22, having a thickness of TOX71. For example, the thickness of TOX71 of the first gate oxide layer may be in the range between 100 Å to 700 Å. Since the buffer oxide layer 72 at this time is formed to have a thickness great enough to cover an edge of the shallow trench 71, thinning of the first gate oxide layer 76 does not occur.

Figure 7D:
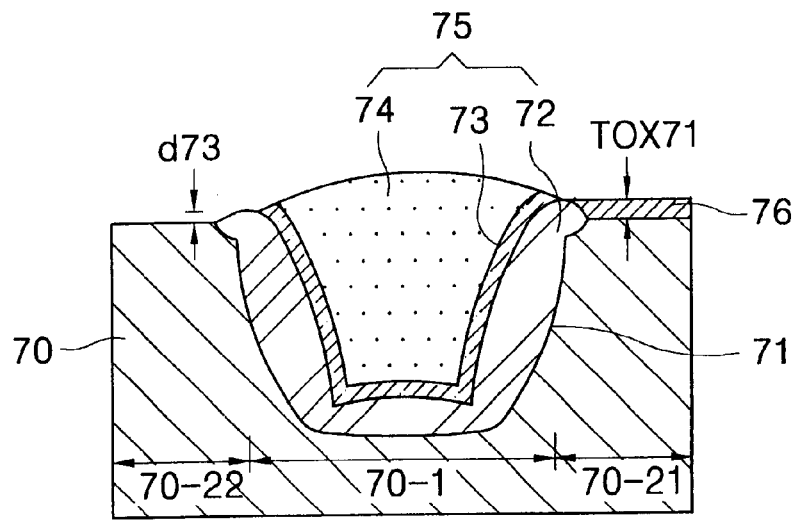

Referring to FIG. 7D, a portion of the first gate oxide layer 76 formed on the second active region 70-22 is removed by a wet-etching technique using a phosphoric acid, exposing the second active region 70-22. Even though a portion of the buffer oxide layer 72 abutted with the edge of the shallow trench 71 is exhausted slightly during this wet-etching process, since the buffer oxide layer 72 is formed to have a sufficient thickness in consideration of this, the STI 75 still has a step height d73 with respect to the active region 70-22. The step height d73 is smaller than the step heights d71 and d72.

Figure 7E:
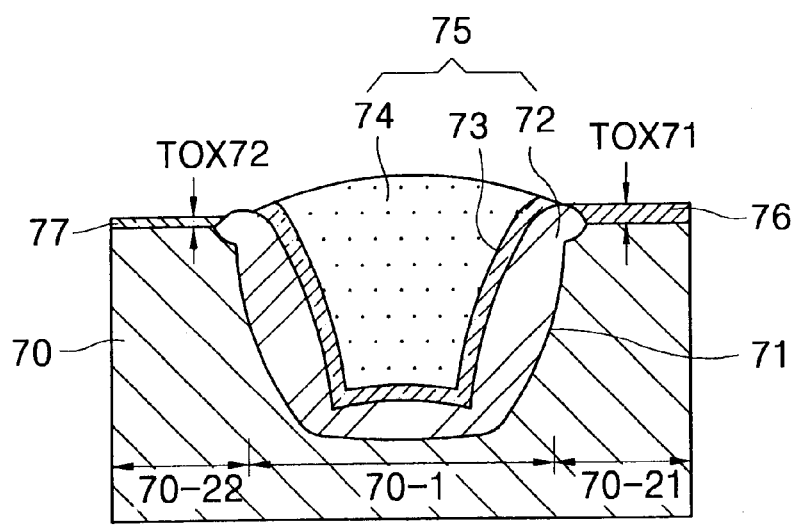

Referring to FIG. 7E, a relatively thin second gate oxide layer 77 is formed on the second active region 70-22 as having a thickness of TOX72. For example, the second gate oxide layer 77 may have a thickness of less than 80 Å. Accordingly, a dual gate oxide layer is formed, whereby thinning of second gate oxide layer 77 does not occur.

In the method of forming the dual gate oxide layer of the embodiment as described above, the buffer oxide layer 72 is formed to a sufficient thickness to cover the edge of the shallow trench 71. As a result, even though the buffer oxide layer 72 is exhausted by a subsequent wet-etching process, the occurrence of a dent is prevented. Incidentally, it should be understood that a formation order of the first and second gate oxide layers can be changed.

Figure 8A:
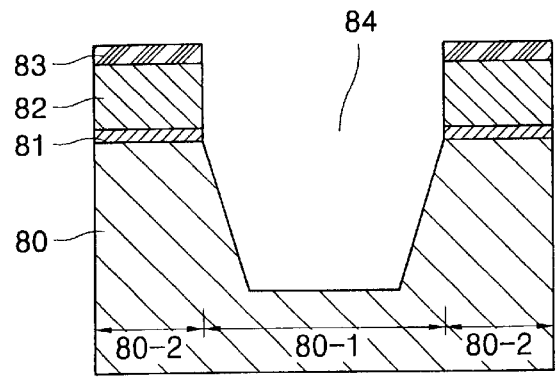
FIGS. 8A to 8G are cross-sectional views illustrating a process of forming a shallow trench isolation according to a still further embodiment of the present invention.

FIGS. 8A to 8G are cross-sectional views illustrating a process of forming a shallow trench isolation according to a still further embodiment of the present invention. Referring to FIG. 8A, a semiconductor substrate 80 is provided having a pad oxide layer 81, a mask layer 82 and an anti-reflection layer 83 which are sequentially stacked thereon. The semiconductor substrate 80 is made of silicon and has a field region 80-1 and active regions 80-2. The pad oxide layer 81 is made of a thermal oxide for example, and the mask layer 82 is made of a nitride. The anti-reflection layer 83 may be made of SiON. Although not shown, the pad oxide layer 81, the mask layer 82 and the anti-reflection layer 83 are patterned to expose the field region 80-1 of the substrate 80. The substrate 80 is then patterned using the mask layer to form a shallow trench 84 as illustrated.

Figure 8B:
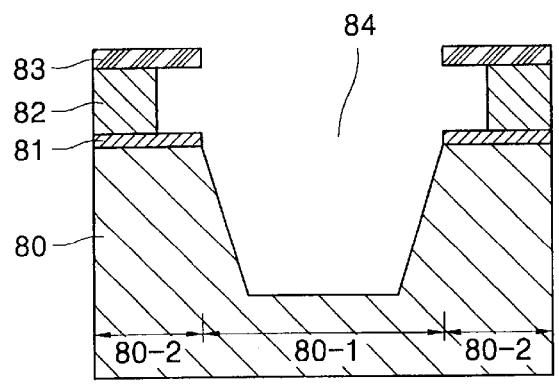

Referring to FIG. 8B, the mask layer 82 is wet-etched using phosphoric acid to be recessed or etched back a predetermined distance from the shallow trench 84. This process is generally called a pull-back process. A pull-back amount of the mask layer 82 depends on an amount of a buffer oxide layer that is to be etched in a subsequent wet-etching process and depends on a thickness of a gate oxide layer that will be formed in a subsequent process. As an example, a pull-back amount of the mask layer 82 may be twice as much as a thickness of the gate oxide layer. In the case of a dual gate oxide layer, a pull-back amount of the mask layer 82 is determined in consideration of a thickness of the gate oxide layer.

Figure 8C:
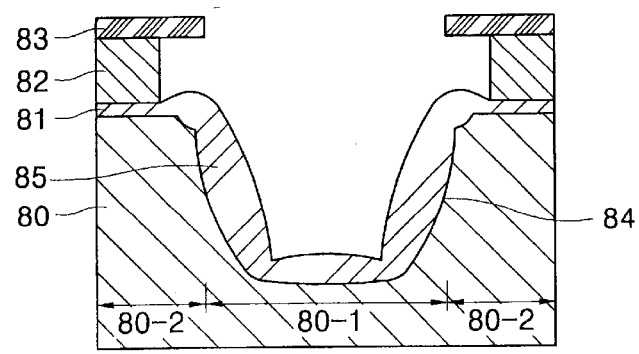

Referring to FIG. 8C, a buffer oxide layer 85 is formed by a thermal oxidation process to cover the shallow trench 84. The buffer oxide layer 85 has a great enough thickness to prevent a thinning of the gate oxide layer, even though the buffer oxide layer 85 is exhausted in a subsequent wet-etching process. The buffer oxide layer 85 may have a thickness of 100 Å to 700 Å. The buffer oxide layer 85 can be made of a CVD oxide which has a relatively low wet-etching rate, instead of a thermal oxide.

Figure 8D:
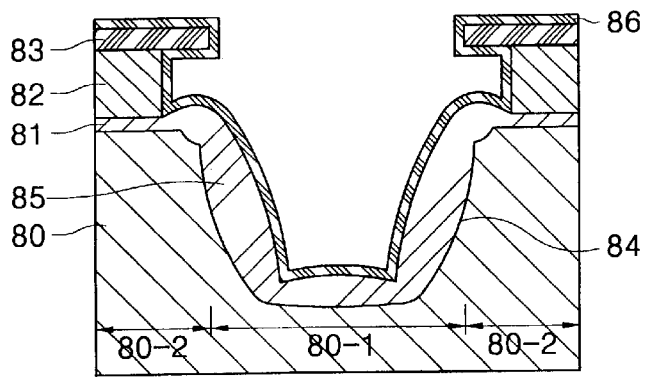

Referring to FIG. 8D, a liner layer 86 is formed over the whole surface of the structure, including on anti-reflection layer 83, recessed mask layer 82 and buffer oxide layer 85 within the shallow trench 84. The liner layer 86 is made of a nitride for example.

Figure 8E:
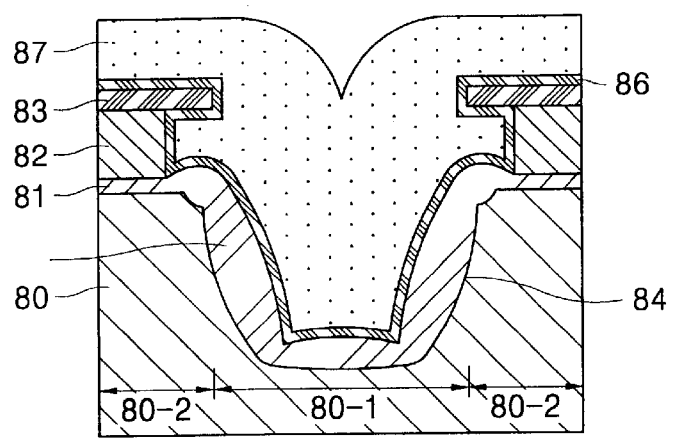

Referring to FIG. 8E, an insulating layer 87 is formed to cover the structure, whereby shallow trench 84 is filled with insulating layer 87. The insulating layer 87 is made of a high density plasma oxide (HDP $SiO_2$) or an undoped silicon glass (USG).

Figure 8F:
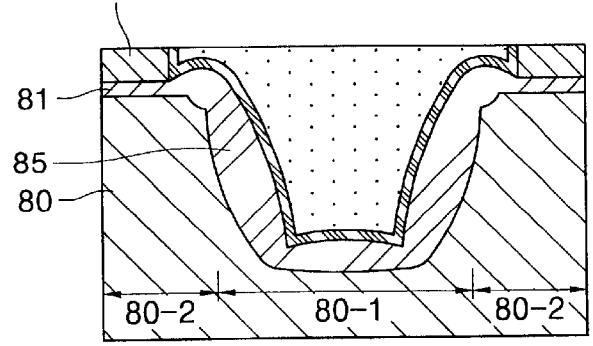

Referring to FIG. 8F, the recessed mask layer 82, the anti-reflection layer 83, the liner layer 86 and the insulating layer 87 are polished by a CMP process to planarize a surface of the semiconductor substrate 80.

Figure 8G:
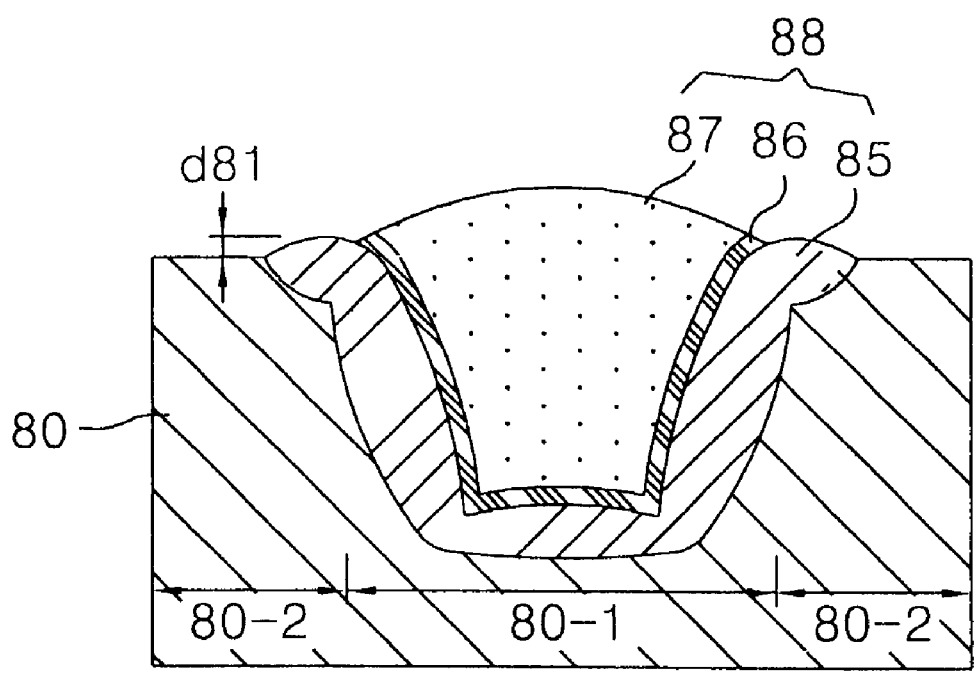

Referring to FIG. 8G, the mask layer 82 is removed. The pad oxide layer 81 is then removed by a wet-etching process to complete a shallow trench isolation (STI) 88. The STI 88 is formed to have a step height d81 with respect to the active region 80-2 of the substrate 80. As a result, even though a dent may occur in buffer oxide layer 85 in a subsequent wet-etching process, the dent is spaced apart from the STI 88 and therefore does not affect characteristics of a device.

The anti-reflection layer 83 serves to minimize undesired effects of scattered reflection, to prevent a thickness of the mask layer from being reduced during a pull-back process, and to prevent the substrate 80 from being damaged by an over-etching during the CMP process. Incidentally, it is to be understood that this method of forming the STI as described with respect to FIGS. 8A–8G can be applied to a process of manufacturing a semiconductor device as described with respect to FIGS. 6A to 6C and FIGS. 7A to 7E.

As described above, the present invention has the following advantages. Since the shallow trench isolation is formed to have a step height with respect to an active region of the substrate, even though a dent may occur in the buffer oxide layer during a subsequent wet-etching process, the dent is spaced apart from the STI, whereupon characteristics of a device are not affected.

Also, since the buffer oxide layer is formed in a state whereby the mask layer is spaced apart from the shallow trench by a predetermined distance, the buffer oxide layer can be formed in the shallow trench to a desired thickness. Further, since a dent resulting from the liner layer can be prevented, a leakage current in the p-n junction region can be prevented, leading to improved isolation characteristics. In addition, since the occurrence of a transistor hump and an electric field concentration can be avoided, a leakage current is prevented, thereby securing stable operation of a device (e.g., transistor). Also, since thinning of the gate oxide layer can be avoided, lowering of breakdown voltage is prevented, and a gate oxide layer having uniform thickness is provided.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming a shallow trench isolation of a semiconductor device, comprising:

providing a semiconductor substrate including a field region and an active region;

forming a first insulating layer and a mask layer on the active region that expose the field region of the substrate;

etching the exposed field region of the substrate to form a shallow trench;

wet-etching a portion of the mask layer to recess the mask layer a predetermined distance from an edge of the shallow trench using a pull-back process;

forming a second insulating layer in the shallow trench, the second insulating layer having a step higher than the active region;

forming a liner layer as covering the mask layer and the second insulating layer within the shallow trench;

forming a third insulating layer as covering the liner layer and filling the shallow trench;

etching the mask layer, the liner layer and the third insulating layer to provide a planarized surface;

removing a remaining portion of the mask layer; and removing a remaining portion of the first insulating layer.

2. The method of claim 1, wherein the mask layer and the liner layer comprise nitride layers.

3. The method of claim 1, wherein the first insulating layer is a pad oxide layer, and the second insulating layer is a buffer oxide layer.

4. The method of claim 1, wherein the second insulating layer has a thickness of 100 Å to 700 Å.

5. The method of claim 4, wherein the second insulating layer is a thermal oxidation layer formed by a thermal oxidation process.

6. The method of claim 4, wherein the second insulating layer is a CVD oxide layer.

7. The method of claim 1, wherein the third insulating layer is a high density plasma (HDP) oxide layer or an undoped silicon glass (USG) layer.

8. The method of claim 1, wherein said forming a first insulating layer and a mask layer further comprises forming an anti-reflection layer on the mask layer that also exposes the field region of the substrate.

9. The method of claim 8, wherein the anti-reflection layer prevents reduction of a thickness of the mask layer during said etching a portion of the mask layer.

10. A method of forming a shallow trench isolation of a semiconductor device, comprising:

providing a semiconductor substrate including a field region and an active region;

forming a first insulating layer and a mask layer on the substrate that expose the field region of the substrate;

etching the exposed field region of the substrate to form a shallow trench;

wet-etching a portion of the mask layer to recess the mask layer a predetermined distance from an edge of the shallow trench using a pull-back process;

forming a second insulating layer in the shallow trench, the second insulating layer having a step higher than the active region;

forming a liner layer as covering the mask layer and the second insulating layer within the shallow trench;

forming a third insulating layer as covering the liner layer and filling the shallow trench;

etching the mask layer, the liner layer and the third insulating layer to provide a planarized surface;

removing a remaining portion of the mask layer;

removing a remaining portion of the first insulating layer;

cleaning the substrate; and forming a gate oxide layer on the active region of the substrate.

11. The method of claim 10, wherein the mask layer and the liner layer comprise nitride layers.

12. The method of claim 10, wherein the first insulating layer is a pad oxide layer, and the second insulating layer is a buffer oxide layer.

13. The method of claim 10, wherein the second insulating layer has a thickness of 100 Å to 700 Å.

14. The method of claim 13, wherein the second insulating layer is a thermal oxidation layer formed by a thermal oxidation process.

15. The method of claim 13, wherein the second insulating layer is a CVD oxide layer.

16. A method of forming a semiconductor device, comprising:

providing a semiconductor substrate including a field region and first and second active regions;

forming a first insulating layer and a mask layer on the substrate to expose the field region of the substrate;

etching the exposed field region of the substrate to form a shallow trench;

wet-etching a portion of the mask layer to recess the mask layer a predetermined distance from an edge of the shallow trench using a pull-back process;

forming a second insulating layer in the shallow trench, the second insulating layer having a step higher than the first and second active regions;

forming a liner layer as covering the mask layer and the second insulating layer within the shallow trench;

forming a third insulating layer as covering the liner layer and filling the shallow trench;

etching the mask layer, the liner layer and the third insulating layer to provided a planarized surface;

removing a remaining portion of the mask layer;

removing a remaining portion of the first insulating layer;

cleaning the substrate;

forming a first gate oxide layer over an entire surface of the substrate;

etching the first gate oxide layer so that the first gate oxide layer remains on the first active region of the substrate; and forming a second gate oxide layer on the second active region of the substrate.

17. The method of claim 16, wherein the mask layer and the liner layer comprise nitride layers.

18. The method of claim 16, wherein the first insulating layer is a pad oxide layer, and the second insulating layer is a buffer oxide layer.

19. The method of claim 16, wherein the second insulating layer has a thickness of 100 Å to 700 Å.

20. The method of claim 19, wherein the second insulating layer is a CVD oxide layer or a thermal oxide layer.

21. The method of claim 16, wherein the third insulating layer is a high density plasma (HDP) oxide layer or an undoped silicon glass (USG) layer.

22. The method of claim 16, wherein the first and second gate oxide layers are formed by a thermal oxidation process.

23. The method of claim 16, wherein the first gate oxide layer is thicker than the second gate oxide layer.

24. The method of claim 23, wherein the first gate oxide layer has a thickness of 100 Å to 700 Å, and the second gate oxide layer has a thickness of less than 80 Å.

25. The method of claim 16, wherein the first gate oxide layer is thinner than the second gate oxide layer.

26. The method of claim 25, wherein the first gate oxide layer has a thickness of less than 80 Å, and the second gate oxide layer has a thickness of 100 Å to 700 Å.

* * * * *